United States Patent [19]

Harrison et al.

[11] Patent Number: 5,677,962
[45] Date of Patent: Oct. 14, 1997

[54] HYBRID ANALOG AND DIGITAL AMPLIFIER WITH A DELAYED STEP CHANGE IN THE DIGITAL GAIN

[75] Inventors: Simon Irving Harrison; Paul Anthony Frindle, both of Witney, United Kingdom

[73] Assignees: Sony Corporation, Tokyo, Japan; Sony United Kingdom Limited, Weybridge, England

[21] Appl. No.: 588,442

[22] Filed: Jan. 18, 1996

[30] Foreign Application Priority Data

Jan. 26, 1995 [GB] United Kingdom ............ 9501566

[51] Int. Cl.$^6$ ...................................... H03G 3/00
[52] U.S. Cl. .................. 381/109; 381/104; 330/278; 330/280; 455/255 R; 455/242.1
[58] Field of Search ........................ 381/104, 107, 381/109, 119, 102, 98; 330/279, 278, 129, 138, 280; 375/345; 455/234.1, 242.1, 242.2, 253.2; 379/395, 390, 409

[56] References Cited

U.S. PATENT DOCUMENTS

| 4,191,995 | 3/1980 | Farrow. | |
|---|---|---|---|
| 4,213,097 | 7/1980 | Chiu et al. . | |
| 4,775,988 | 10/1988 | Chevillat et al. | 375/345 |
| 5,297,184 | 3/1994 | Behrens et al. | 375/345 |
| 5,436,933 | 7/1995 | Andruzzi, Jr. | 375/345 |

FOREIGN PATENT DOCUMENTS 2229333A 9/1990 United Kingdom .

*Primary Examiner*—Curtis Kuntz
*Assistant Examiner*—Ping W. Lee
*Attorney, Agent, or Firm*—William S. Frommer; Alvin Sinderbrand

[57] ABSTRACT

An amplifier comprises a variable gain analog amplifier for amplifying an input analog signal to generate an intermediate analog signal, the gain of the analog amplifier being switchable between two or more discrete gain values. An analog to digital converter converts the intermediate analog signal into a corresponding intermediate digital signal and a variable gain digital amplifier amplifies the intermediate digital signal. A gain control circuit, responsive to a required gain, selects one of the discrete gain values of the analog amplifier and a gain value of the digital amplifier so that the sum of the selected gain values is substantially equal to the required gain; and whether the required gain is increasing or decreasing is detected. If the required gain is decreasing, a delay circuit delays, by a predetermined period longer than a gain switching period of the analog amplifier, a step change in the gain value of the digital amplifier when the gain control circuit changes the selected discrete gain value for the analog amplifier. This can avoid subjectively disturbing transient boosts in the overall system gain when the analog amplifier's gain is switched.

5 Claims, 3 Drawing Sheets

HYBRID ANALOG AND DIGITAL AMPLIFIER WITH A DELAYED STEP CHANGE IN THE DIGITAL GAIN

BACKGROUND OF THE INVENTION

1. Field of the Invention

This invention relates to amplifiers, and more particularly to variable gain amplifiers associated with or including analogue-to-digital converters.

2. Description of the Prior Art

Analogue-to-digital (A/D) converters are used to convert analogue input signals (such as an analogue audio signal) into digital output signals for subsequent digital processing. One example of the use of A/D converters is at the channel inputs of a digital audio mixing console.

It is possible to adjust the level of the digital signal output by an A/D converter by processing carried out in the digital domain. Put simply, it is merely necessary to multiply the digital output of the A/D converter by a gain coefficient, which may be less than or greater than unity (in this regard, the single term "amplify" is used in this document for simplicity, even if the "amplifier's"gain is less than unity).

However, the use of A/D converters in this way, and in particular this method of level adjustment, relies on the level of the input analogue signal being reasonably well matched to the signal levels expected by the input stage of the A/D converter. If the level of the analogue signal is too high then clipping can occur. Conversely, if the analogue signal level is too low, then the A/D conversion process can suffer from excessive quantising noise.

This latter problem is a significant danger when analogue signals from microphones are being supplied to an A/D converter. This is because the output signal level from a microphone tends to be very low in comparison to, say, the line output from an electronic musical instrument or tape recorder. Accordingly, an analogue pre-amplifier is often used to increase the microphone's analogue signal level before that signal is supplied to the input stage of the A/D converter.

FIG. 1 of the accompanying drawings illustrates the previously proposed arrangement described above, which forms part of a channel input stage of a digital audio mixing console 100. A microphone 10 supplies a low-level analogue signal to an analogue amplifier 20. The analogue amplifier's output signal is passed to the input of an A/D converter 30, which converts the analogue signal into a corresponding digital audio signal. The level of the digital audio signal may then be varied by a digital amplifier 40, which is basically a multiplier as described above. The analogue amplifier 20 and the digital amplifier 40 both operate under the control of a user-operable gain control device 50 which, in this example, forms a part of the digital audio mixing console 100, and which supplies a "required gain" control signal to a gain controller 60.

The gain of the analogue amplifier 20 is adjustable only in discrete (6 decibel (dB)) steps, and so this amplifier serves to ensure that the signal level supplied to the A/D converter 30 is broadly correct to avoid excessive clipping or quantising noise. Finer gain adjustment is made using the digital amplifier 40, which has a variable gain over a range of at least 0–6 dB. In this way, any required gain value can be achieved by the gain controller 60 setting the gain of the analogue amplifier to the next lowest 6 dB step, and then providing up to 6 dB of additional gain using the digital amplifier 40, so that the combined effect of the analogue and digital amplifiers provides the required gain.

A problem can arise with the arrangement described above, because the gain of digital amplifiers generally changes more quickly than the gain of switched-gain analogue amplifiers. This problem will now be described in more detail with reference to FIGS. 2 and 3 of the accompanying drawings.

FIG. 2 is a schematic graph illustrating a desired gain adjustment 110 (i.e. the gain set by the user on the control 50 and represented by the "required gain" signal in FIG. 1), the gain variation 120 of the digital amplifier 40, the gain variation 130 of the analogue amplifier 20, and the resulting overall gain 140 of the combination of the digital and analogue amplifiers.

As the required gain 110 increases, the analogue amplifier's gain 130 initially remains constant and only the digital amplifier's gain is increased. However, at a certain point 150 the digital amplifier's gain reaches its maximum (6 dB). At this point, therefore, the gain of the analogue amplifier is stepped up by 6 dB and the gain of the digital amplifier is stepped down to 0 dB, to start increasing from 0 dB again.

However, because the gain change of the analogue amplifier 20 is slower than that of the digital amplifier 40, there is a short period 160 (of maybe a few milliseconds) during which the digital amplifier's gain has been stepped down to 0 dB but the analogue amplifier's gain has not yet increased by the required 6 dB. During this short period there is therefore a transient cut or reduction 170 in the signal output by the digital amplifier 40.

FIG. 3 is similar to FIG. 2 but shows the situation when the required gain 110 is decreasing. As the required gain 110 decreases, it reaches a point 180 at which the digital amplifier's gain has reached its minimum of 0 dB. At this point, the gain of the analogue amplifier is switched down by a step of 6 dB, and the gain of the digital amplifier is stepped up, to start decreasing from 6 dB again.

Once again, the analogue amplifier's gain 130 changes later than the digital amplifier's gain. However, there is now a short period 190 during which the digital amplifier's gain has increased by 6 dB but before the analogue amplifier's gain has decreased by the required 6 dB. This leads to a transient 6 dB increase or boost 200 in the overall gain of the combination of the digital amplifier 40 and the analogue amplifier 20 during the period 190.

Accordingly, the delay between the switching times of the digital and analogue amplifiers leads to undesirable transient cuts or boosts in the gain applied to the microphone input signal in FIG. 1.

SUMMARY OF THE INVENTION

It is an object of the invention to provide an amplifier which alleviates the above problems.

This invention provides an amplifier comprising:

a variable gain analogue amplifier for amplifying an input analogue signal to generate an intermediate analogue signal, the gain of the analogue amplifier being switchable between two or more discrete gain values;

an analogue to digital converter for converting the intermediate analogue signal into a corresponding intermediate digital signal;

a variable gain digital amplifier for amplifying the intermediate digital signal; and gain control means, responsive to a required gain, for selecting one of the discrete gain values of the analogue amplifier and a gain value of the digital amplifier so that the combined effect of the selected gain values is substantially equal to the required gain, the gain control means comprising means for detecting whether the required gain is increasing or decreasing, and means, responsive to a detection that the required gain is decreasing, for delaying, by a predetermined period longer than a gain switching period of the analogue amplifier, a step change in the gain value of the digital amplifier when the gain control means selects a new discrete gain value for the analogue amplifier.

The invention recognises that transient cuts in input signal gain are subjectively far less disturbing than transient boosts. Since the transient boosts occur in the arrangement of FIG. 1 when the required gain is decreasing, an amplifier according to the invention delays the switching of the digital amplifier's gain only when the required gain is decreasing. This means that the step change (e.g. a 6 dB increase) in the digital amplifier's gain occurs slightly after the step decrease in the analogue amplifier's gain, leading to a transient cut (rather than a transient boost) in signal level.

This elegantly simple solution to the problem is advantageous over an alternative approach which might involve trying to switch the two amplifiers simultaneously, because it does not rely on such stringently accurate timing (which can be a particular problem in the case of, for example, a digital audio mixing console where the digital and analogue amplifiers might be sited some distance apart). Also, the invention does not require an analogue amplifier for which the switching period is accurately repeatable between amplifiers and over time.

Preferably the gain of the digital amplifier is variable over a range substantially equal to the interval between the discrete gain values of the analogue amplifier.

The invention is particularly suitable for use with audio signals, and in particular low-level audio signals such as microphone output signals. An amplifier according to the invention is accordingly useful as an audio input stage for a digital audio processing apparatus. The invention also encompasses digital audio processing apparatus comprising such an input stage.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
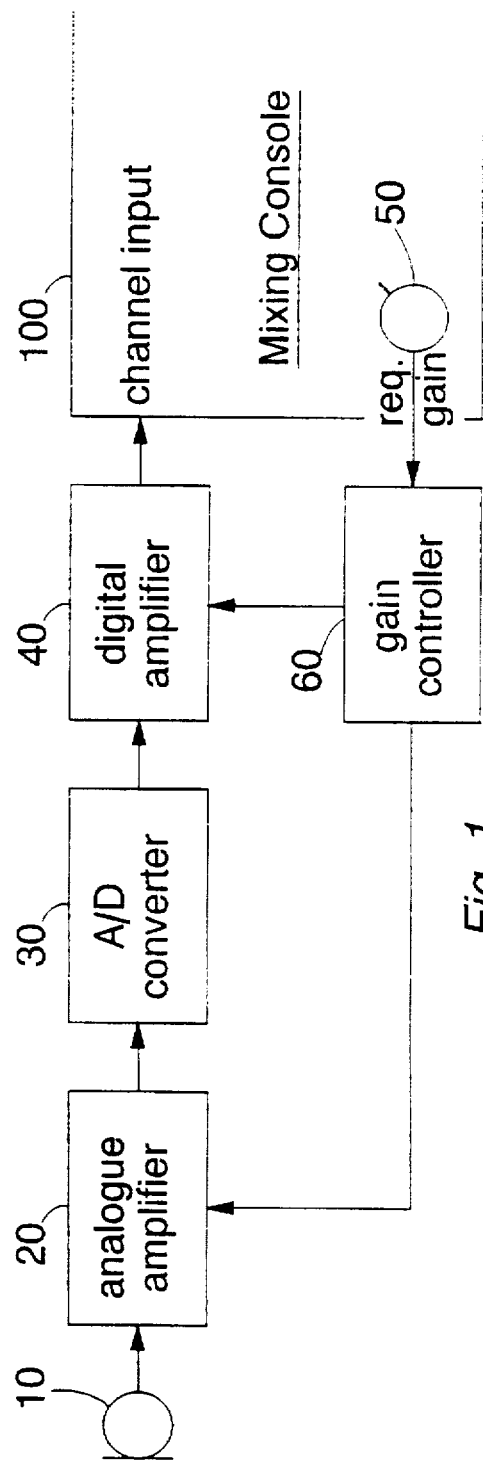
FIG. 1 is a schematic diagram of a microphone input stage of a previously proposed digital audio mixing console.
Figure 4:
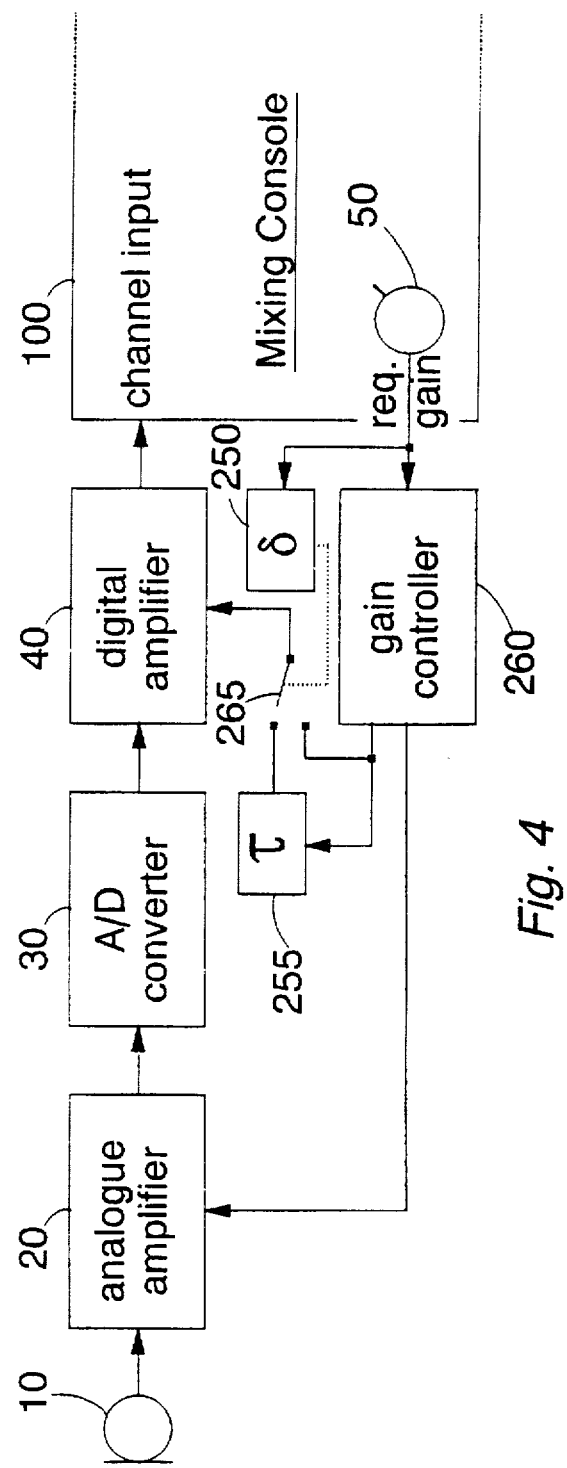
FIG. 4 is a schematic diagram of a microphone input stage according to an embodiment of the present invention.

Referring now to FIG. 4, the microphone input stage of a digital audio mixing console 100 comprises, in similar manner to FIG. 1, comprises a switched gain analogue amplifier 20 connected to a microphone 10, with the output of the analogue amplifier supplying an A/D converter 30. The digitised output of the A/D converter is passed to a variable gain digital amplifier 40, the output of which is fed to an input channel of the console 100. A gain control 50 on the console 100 supplies a "required gain" signal to a gain controller 260 which controls the gain of the analogue amplifier 20 and the digital amplifier 40. The operation of the devices 10, 20, 30, 40, 50 and 100 is identical to that of the corresponding parts in FIG. 1 described above and, apart from the differences described below, the operation of the gain controller 260 is similar to that of the gain controller 60 described above.

The gain control information generated by the gain controller 260 to control the gain of the digital amplifier 40 may be supplied to the digital amplifier 40 either directly or via a delay circuit 255. The selection of whether the gain control information is delayed is made by a switch 265, which in turn is controlled by a differentiator circuit 250.

The differentiator (or similar) circuit 250 detects whether the required gain is increasing or decreasing. If the required gain is detected by the differentiator circuit 250 to be decreasing then the differentiator circuit controls the switch 265 to select the delayed output of the delay circuit 255. If the gain is detected to be increasing then the delayed output of the delay circuit 255 is not selected.

The delay imposed by the delay circuit 255 causes a delay in a step increase in the gain of the digital amplifier from 0 dB to 6 dB by a predetermined time period, although the reduction by 6 dB in the analogue amplifier's gain is initiated immediately. The delay applied by the delay circuit 255 is preselected to be longer than the switching period of the analogue amplifier used, taking into account the normal variation between amplifiers and over time. For example, if the switching period of the particular design of analogue amplifiers used varies between about, say, 3 milliseconds and 5 milliseconds, a 10 millisecond delay could be imposed by the delay circuit 255 on the switching time of the digital amplifier's gain.

Figure 5:
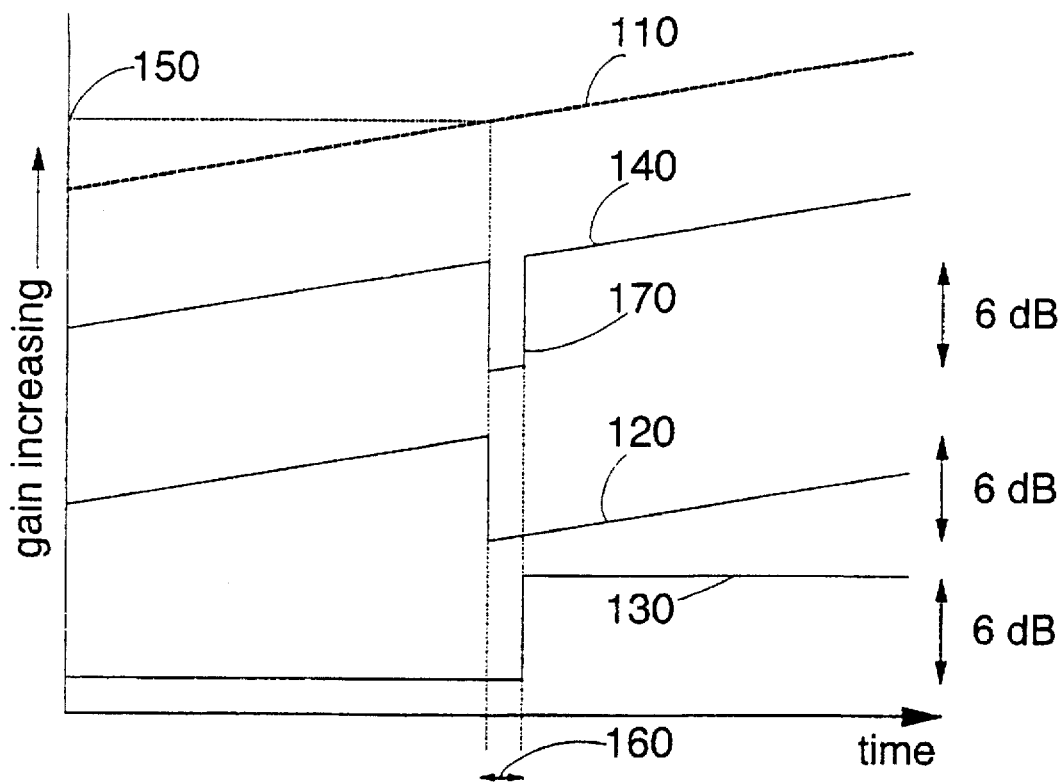
FIG. 5 is a schematic graph of gain variation of the input stage of FIG. 4 when a required gain is increasing.
Figure 6:
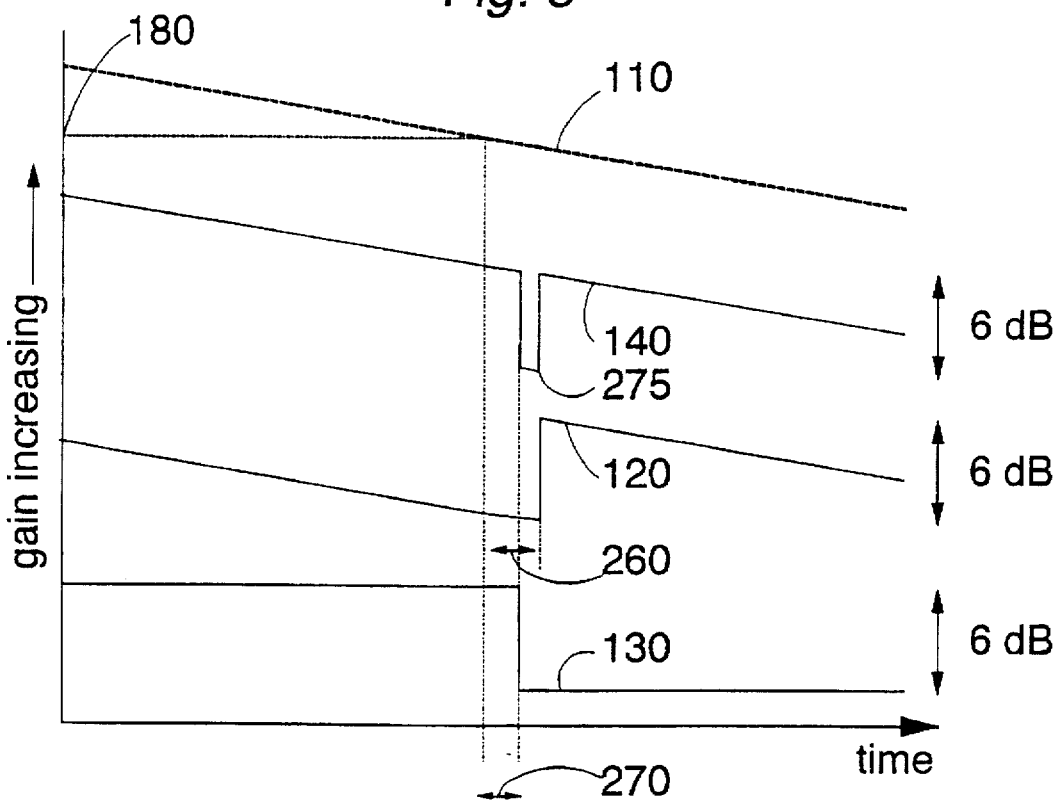
FIG. 6 is a schematic graph similar to FIG. 5, for the case when the required gain is decreasing.

The effect of these measures is illustrated in FIGS. 5 and 6.

Figure 2:
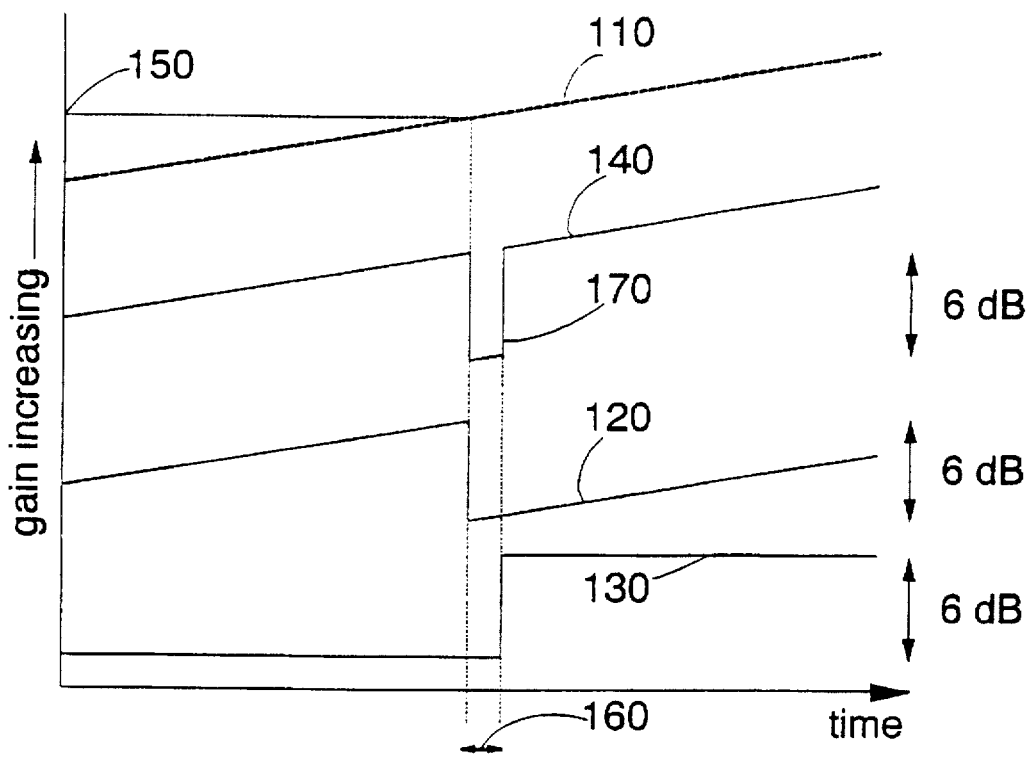
FIG. 2 is a schematic graph of gain variation of the input stage of FIG. 1 when a required gain is increasing.

FIG. 5 is a schematic graph (which in fact is identical to FIG. 2 described above) illustrating a desired gain adjustment 110 (i.e. the gain set by the user on the control 50, represented by the "required gain" signal in FIG. 4), the gain variation 120 of the digital amplifier 40, the gain variation 130 of the analogue amplifier 20, and the resulting overall gain 141) of the combination of the digital and analogue amplifiers, for the embodiment of FIG. 4.

In FIG. 5 the required gain is increasing, so the differentiator circuit does not cause a delay to be applied to the switching time of the digital amplifier. There is therefore a transient cut 170 at the switching time, identical to the transient cut shown in FIG. 2 described above.

FIG. 6 is a similar graph, illustrating the effect of the embodiment of FIG. 4 when the required gain 110) is decreasing. In this case, the differentiator circuit 250 selects the output of the delay circuit 265, causing the switching of the digital amplifier's gain from 6 dB to 0 dB to be delayed by the predetermined time period as described above.

At the point 180, the gain of the digital amplifier 40 has reached 0 dB. The analogue amplifier's gain is therefore decreased by 6 dB (which takes effect after a switching delay period 270), but the gain of the digital amplifier is not changed from 0 dB to 6 dB until the predetermined delay period imposed by the delay circuit 255 (the delay being illustrated as 261)) has passed.

Figure 3:
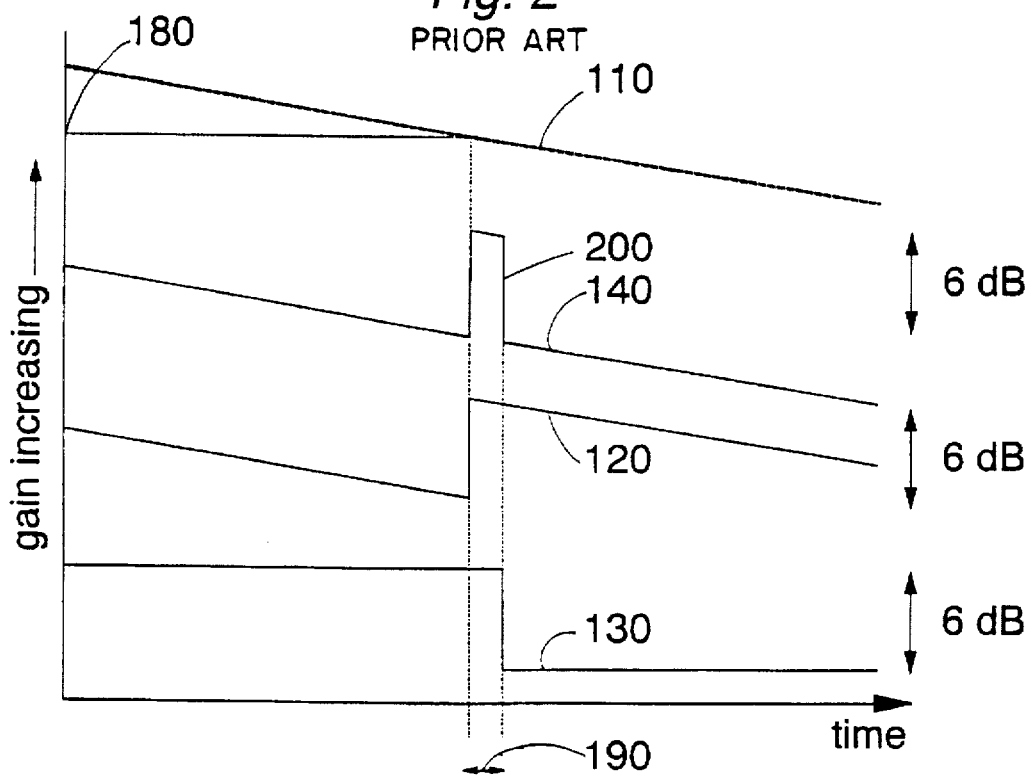
FIG. 3 is a schematic graph similar to FIG. 2, for the case when the required gain is decreasing.

The result of these measures is that instead of a transient boost (as in FIG. 3 described above), the overall gain 140 of the signal undergoes a transient cut 275 of 6 dB, which is subjectively much less disturbing than a transient boost.

The output of the delay circuit 255 could be selected whenever the differentiator circuit detects a negative slope in the required gain signal, or could be selected only at (or very slightly before) the time at which a step increase in the digital amplifier's gain is to be made. This latter arrangement would require a minor modification of FIG. 4, to provide an indication from the gain controller 260 to the differentiator/switch arrangement that the digital amplifier's gain is close to 0 dB. This indication would then be combined with the detection of a decreasing required gain to select the output of the delay circuit 255. Although when the output of the delay circuit 255 is first selected there may be a slight change or glitch in the digital amplifier's gain, this is likely to be very small indeed since under normal circumstances the required gain signal will have changed very little during the delay period imposed by the delay circuit 255. (Any such glitch could be alleviated in embodiments where the gain controller transmits incremental rather than absolute gain control information to the digital amplifier 40, along with reset indications to return the gain to 0 or 6 dB when necessary).

In FIG. 6, the gain of the digital amplifier continues to be reduced slightly during the delay period 260. However, in an alternative embodiment the digital amplifier's gain could be held constant during this period.

The embodiment described above show the gain controller (and associated differentiator 250, delay circuit 255 and switch 265) and the digital amplifier as separate units to the console 100. However, these two units could of course be incorporated into the control and signal processing operations of the digital console. Similarly, it is envisaged that two or more of the analogue amplifier, the A/D converter and the digital amplifier could be embodied in a single unit.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An amplifier comprising:

a variable gain analogue amplifier for amplifying an input analogue signal to generate an intermediate analogue signal, a gain of said analogue amplifier being switchable between two or more discrete gain values;

an analogue to digital converter for converting said intermediate analogue signal into a corresponding intermediate digital signal;

a variable gain digital amplifier for amplifying said intermediate digital signal; and gain control means, responsive to a required gain, for selecting one of said discrete gain values of said analogue amplifier and a gain value of said digital amplifier so that the combined effect of said selected gain values is substantially equal to said required gain, said gain control means comprising means for detecting whether said required gain is increasing or decreasing, and means, responsive to a detection that said required gain is decreasing, for delaying, by a predetermined period longer than a gain switching period of said analogue amplifier, a step change in said gain value of said digital amplifier when said gain control means selects a new discrete gain value for said analogue amplifier.

2. An amplifier according to claim 1, in which said gain of said digital amplifier is variable over a range substantially equal to an interval between said discrete gain values of said analogue amplifier.

3. An amplifier according to claim 1, in which said input analogue signal is an analogue audio signal.

4. An audio input stage for a digital audio processing apparatus, said input stage comprising an amplifier including:

a variable gain analogue amplifier for amplifying an input analogue signal to generate an intermediate analogue signal, a gain of said analogue amplifier being switchable between two or more discrete gain values;

an analogue to digital converter for converting said intermediate analogue signal into a corresponding intermediate digital signal;

a variable gain digital amplifier for amplifying said intermediate digital signal; and gain control means, responsive to a required gain, for selecting one of said discrete gain values of said analogue amplifier and a gain value of said digital amplifier so that the combined effect of said selected gain value is substantially equal to said required gain, said gain control means comprising means for detecting whether said required gain is increasing or decreasing, and means, responsive to a detection that said required gain is decreasing, for delaying, by a predetermined period longer than a gain switching period of said analogue amplifier, a step change in said gain value of said digital amplifier when said gain control means selects a new discrete gain value for said analogue amplifier.

5. Digital audio processing apparatus comprising an input stage having an amplifier including: including:

a variable gain analogue amplifier for amplifying an input analogue signal to generate an intermediate analogue signal, a gain of said analogue amplifier being switchable between two or more discrete gain values;

an analogue to digital converter for converting said intermediate analogue signal into a corresponding intermediate digital signal;

a variable gain digital amplifier for amplifying said intermediate digital signal; and gain control means, responsive to a required gain, for selecting one of said discrete gain values of said analogue amplifier and a gain value of said digital amplifier so that the combined effect of said selected gain value is substantially equal to said required gain, said gain control means comprising means for detecting whether said required gain is increasing or decreasing, and means, responsive to a detection that said required gain is decreasing, for delaying, by a predetermined period longer than a gain switching period of said analogue amplifier, a step change in said gain value of said digital amplifier when said gain control means selects a new discrete gain value for said analogue amplifier.

* * * * *